(12) United States Patent
Takamura

(10) Patent No.: US 8,300,966 B2
(45) Date of Patent: Oct. 30, 2012

(54) IMAGE SIGNAL ENCODING METHOD AND DECODING METHOD, INFORMATION SOURCE ENCODING METHOD AND DECODING METHOD, APPARATUSES THEREFOR, PROGRAMS THEREFOR, AND STORAGE MEDIA WHICH STORE THE PROGRAMS TO PROCESS GAUSSIAN INTEGER SIGNAL

(75) Inventor: Seishi Takamura, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 763 days.

(21) Appl. No.: 12/446,818

(22) PCT Filed: Nov. 8, 2007

(86) PCT No.: PCT/JP2007/071719
§ 371 (c)(1),
(2), (4) Date: Apr. 23, 2009

(87) PCT Pub. No.: WO2008/059752
PCT Pub. Date: May 22, 2008

(65) Prior Publication Data
US 2010/0027903 A1 Feb. 4, 2010

(30) Foreign Application Priority Data

Nov. 14, 2006 (JP) ................................. 2006-307512

(51) Int. Cl.
*G06K 9/36* (2006.01)
(52) U.S. Cl. ................... 382/248; 382/245; 375/240.24; 375/261; 375/265
(58) Field of Classification Search .................. 382/232, 382/245, 248, 250; 375/240.24, 261, 265
See application file for complete search history.

(56) References Cited

U.S. PATENT DOCUMENTS 5,303,265 A 4/1994 McLean
(Continued)

FOREIGN PATENT DOCUMENTS

EP 1 653 628 A1 5/2006
(Continued)

OTHER PUBLICATIONS

Jeong, Dae Gwon, et al., "Uniform and Piecewise Uniform Lattice Vector Quantization for Memoryless Gaussian and Laplacian Sources," IEEE Transactions on Information Theory, vol. 39, No. 3, May 1993, pp. 786-804.

(Continued)

*Primary Examiner* — Jingge Wu
*Assistant Examiner* — Eueng-Nan Yeh
(74) *Attorney, Agent, or Firm* — Harness, Dickey & Pierce, P.L.C.

(57) ABSTRACT

An information source encoding method for encoding a Gaussian integer signal includes the steps of: inputting a signal value sequence of a Gaussian integer signal as an encoding target; transforming signal values included in the input signal value sequence into integer pairs, each having two integers, arranged in the input order; regarding each of the integer pairs as a lattice point on two-dimensional coordinates, and obtaining integer values greater than or equal to zero by performing a two-dimensional-to-one-dimensional mapping in which the shorter the distance from each lattice point to the origin, the smaller the value assigned to the lattice point by the mapping; and encoding the integer values using codes which are used for encoding an information source that follows an exponential distribution.

18 Claims, 14 Drawing Sheets

U.S. PATENT DOCUMENTS

| | | | |
|---|---|---|---|
| 5,764,374 A | 6/1998 | Seroussi et al. | |
| 6,137,589 A * | 10/2000 | Obrador et al. | 358/1.16 |
| 6,628,717 B1 | 9/2003 | Jeong et al. | |
| 6,668,092 B1 * | 12/2003 | Sriram et al. | 382/244 |
| 7,015,837 B1 | 3/2006 | Malvar | |
| 2002/0163965 A1 | 11/2002 | Lee et al. | |
| 2003/0118242 A1 | 6/2003 | Nakayama et al. | |
| 2006/0092053 A1 * | 5/2006 | Malvar | 341/51 |
| 2006/0273937 A1 | 12/2006 | Ishikawa | |

FOREIGN PATENT DOCUMENTS

| | | |
|---|---|---|
| JP | 10-243395 A | 9/1998 |
| JP | 2001-005967 | 1/2001 |
| RU | 2 117 388 C1 | 8/1998 |
| RU | 2 313 174 C2 | 12/2007 |

OTHER PUBLICATIONS

McRae, Graeme, "Counting Rationals," 2000 clicks—Math Help, Nov. 15, 2000, pp. 1-3, retrieved from the Internet: URL: http://2000clicks.com/MathHelp/AlgebraOnline/a001115CountingRationalsSquareSpiral.htm (retrieved on Oct. 28, 2011).

Kiely, A., et al., "Generalized Golomb Codes and Adaptive Coding of Wavelet-Transformed Image Subbands," IPN Progress Report, No. 42-154, Aug. 15, 2003, pp. 1-14.

Merhav, Neri, et al., "Modeling and Low-Complexity Adaptive Coding for Image Prediction Residuals," Proceedings of the International Conference on Image Processing, Lausanne, Switzerland, Sep. 16-19, 1996, pp. 353-356.

P. Boldi, S. Vigna: "Compressed perfect embedded skip lists for quick inverted-index lookups", Proceedings of String Processing and Information Retrieval, 12th International Conference, pp. 1-15, 2005, (Nov. 2-4, 2005).

S. Xue, Y. Xu, B. Oelmann: Hybrd Golomb codes for a group of quantised GG sources, IEE Proceedings, Vision Image and Signal Processing, vol. 150, No. 4, pp. 256-260, 2003, (Feb. 2003).

* cited by examiner

| z | 0 | 1 | 2 | 3 | 4 | 5 | 6 | 7 | 8 | ...... |
|---|---|---|---|---|---|---|---|---|---|---|
| (x, y) | (0, 0) | (1, 0) | (0, 1) | (-1, 0) | (0, -1) | (1, -1) | (1, 1) | (-1, 1) | (-1, -1) | ...... |

FIG. 5

```
Z ⇐ φ {empty set}
z ⇐ 0
dmin ⇐ 0
loop {compute minimum value (dmin) of distance from origin to
                                    lattice points (not yet arranged)}
    for all (x,y) such that l(x,y) ≤ dmin and (x,y) ∉ Z do
        d ⇐ l(x,y)
        if d < dmin then
            dmin ⇐ d
        end if
    end for
    repeat
        found ⇐ false
        for all (x,y) such that l(x,y) ≤ dmin and (x,y) ∉ Z do
            if l(x,y) = dmin then {arrange points having distance dmin
                                            and store them in Z}
                found ⇐ true
                print z,(x,y)
                Z ⇐ Z ∪ (x,y)
                z ⇐ z + 1
            end if
        end for
    until found = true
    dmin ⇐ dmin + 1 {if there is no point to be arranged, then extend
                                    processing area and return to start}
end loop
```

| z | g = 1 | g = 2 | g = 3 | g = 4 | g = 5 | g = 6 |
|---|---|---|---|---|---|---|
| 0 | 0 | 00 | 00 | 000 | 000 | 000 |
| 1 | 10 | 01 | 010 | 001 | 001 | 001 |
| 2 | 110 | 100 | 011 | 010 | 010 | 0100 |
| 3 | 1110 | 101 | 100 | 011 | 0110 | 0101 |
| 4 | 11110 | 1100 | 1010 | 1000 | 0111 | 0110 |
| 5 | 111110 | 1101 | 1011 | 1001 | 1000 | 0111 |
| 6 | 1111110 | 11100 | 1100 | 1010 | 1001 | 1000 |
| 7 | 11111110 | 11101 | 11010 | 1011 | 1010 | 1001 |
| 8 | 111111110 | 111100 | 11011 | 11000 | 10110 | 10100 |
| 9 | 1111111110 | 111101 | 11100 | 11001 | 10111 | 10101 |
| 10 | 11111111110 | 1111100 | 111010 | 11010 | 11000 | 10110 |

IMAGE SIGNAL ENCODING METHOD AND DECODING METHOD, INFORMATION SOURCE ENCODING METHOD AND DECODING METHOD, APPARATUSES THEREFOR, PROGRAMS THEREFOR, AND STORAGE MEDIA WHICH STORE THE PROGRAMS TO PROCESS GAUSSIAN INTEGER SIGNAL

TECHNICAL FIELD

The present invention relates to an image signal encoding method for easily and efficiently encoding an image signal which represents a Gaussian integer signal; an image signal decoding method for decoding encoded data generated by the image signal encoding method; an information source encoding method for easily and efficiently encoding a Gaussian integer signal and a corresponding apparatus; an information source decoding method for decoding encoded data generated by the information source encoding method and a corresponding apparatus; an information source encoding program for implementing the information source encoding method and a computer-readable storage medium which stores the program; and an information source decoding program for implementing the information source decoding method and a computer-readable storage medium which stores the program.

Priority is claimed on Japanese Patent Application No. 2006-307512, filed Nov. 14, 2006, the contents of which are incorporated herein by reference.

BACKGROUND ART

A Gaussian signal is a signal whose generation probability follows a normal distribution (also called "Gaussian distribution"), where the normal distribution appears in various scenes in mathematical and engineering fields and thus is an extremely important distribution.

It is assumed that a Gaussian signal as an encoding target here has integer signal values. Additionally, in general, it is assumed that the signal average is zero and the signal values are "iid" (independent and identically distributed).

Many methods for encoding an integer signal are known. For example, Golomb codes are widely used by which a signal which follows an exponential distribution (which may be called "Laplacian distribution" or "geometric distribution", and is a bilateral exponential distribution unless stated otherwise) can be efficiently encoded without using a table for the encoding or decoding, where the codes can be very easily processed and momentarily decoded. In addition, any large integer input value can be encoded using the Golomb codes.

The code representation of the Golomb codes varies depending on a Golomb code parameter (called "g" here) which has an integer value greater than or equal to 1.

The table in FIG. 20 shows Golomb codes (Golomb code parameter g=1, . . . , 6) corresponding to integer z=0, . . . , 10. The Golomb codes has a relationship for each code parameter g, such that when the value of the integer z (to be encoded) increases by the value of g, the code length increases by 1.

As the increase of the code length is moderated in accordance with the increase in the Golomb code parameter g, a relatively large value of the Golomb code parameter g is suitable for encoding a gentle distribution. In contrast, as the increase of the code length becomes rapid in accordance with the decrease in the Golomb code parameter g, a relatively small value of the Golomb code parameter g is suitable for encoding a steep distribution which converges at zero.

In an image signal, a difference in brightness between pixels which are adjacent temporally or spatially, or an orthogonal transformation coefficient of the brightness value of each pixel is an example of the signal which follows the exponential distribution, and the Golomb codes may be used for encoding such a signal.

On the other hand, Huffman codes use a code table, can be momentarily decoded, and the average amount of code thereof is shortest (i.e., compact codes) among all variable-length codes. Additionally, arithmetic codes can compress a static signal source to a logical limit (which may be superior in comparison with the compact codes) by using a method different from that used by the variable-length codes.

Patent-Document 1 as shown later discloses an invention for vector-quantizing a feature quantity of an image in accordance with a binary search tree using a neural network, and this invention relates to a technique for encoding an image by means of dynamic Huffman codes.

FIG. 21 shows frequency distributions of the normal distribution and the exponential distribution, where the average is 0, and the dispersion is 16. The vertical axis shows the frequency probability, and logarithm is used so as to show both tail parts of each distribution in an easily understandable manner. As shown in FIG. 21, in the vertical logarithm scale, the normal distribution has a parabolic form, and the exponential distribution has a triangular form.

In order to encode such a bilaterally symmetrical integer distribution, each value should be converted into an integer greater than or equal to zero by using, mostly, a method of representing each value using sign (positive/negative) information and absolute value information separately, or a relatively simple conversion as shown below.

When the values before and after the above conversion are respectively indicated by a and b, the conversion is represented as:

$$b=2a-1 \text{ when } a>0$$

$$b=-2a \text{ when } a\leq 0$$

In accordance with such a conversion, a=−3, −2, −1, 0, 1, 2, 3 are converted respectively into b=6, 4, 2, 0, 1, 3, 5.

When the Golomb codes are used for encoding a Gaussian signal, the encoding efficiency is considerably degraded in comparison with the Huffman codes and the arithmetic codes. This is an essential problem caused because the signal generation probability assumed for the Golomb codes does not follow a normal distribution, but follows an exponential distribution.

Similar to the Golomb codes, there are many kinds of codes which do not need a code table, and may be Fibonacci codes, Elias codes, or Exp-Golomb codes. However, there are no codes to which an assumption that the signal generation probability follows the normal distribution is applied.

Non-Patent Document 1 (shown later) recites on page 8 that "contrarily to what happens for geometric and double-sided geometric distributions, there is no simple, instantaneous code for the normal distribution". That is, there are no codes to which an assumption that the signal generation probability follows the normal distribution is applied.

Therefore, if the encoding efficiency is given priority in the encoding of a Gaussian signal, conventionally, Huffman codes or arithmetic codes have been used.

However, this also has the following problems:

(i) The arithmetic codes require a frequency table, which is not required by the Golomb codes, in both the encoder and the decoder.
(ii) The Huffman codes require a code table or a frequency table, which is not required by the Golomb codes, in both the encoder and the decoder.
(iii) It is necessary for both kinds of codes to determine in advance a range in which encoding of every input value cannot be performed without an exception process, that is, to detect an input value range.
(iv) For both kinds of codes, the amount of processing is larger than that of the Golomb codes, where the amount of processing of the arithmetic codes is particularly large.

In addition, Non-Patent Document 2 shown below proposes Hybrid Golomb codes by which a generalized Gaussian signal source can be momentarily decoded. Although it is possible to encode and decode any large integer input value in this case, it requires a complex structure, and targets a distribution which is further steeper than the exponential distribution steeper than the normal distribution.

Additionally, if easiness of the encoding processing is given priority in the encoding of a Gaussian signal, conventionally, as shown in Non-Patent Document 1, the Golomb codes have been used at the cost of the encoding efficiency. However, this case has a problem that optimization of the Golomb code parameter is necessary.

Patent Document 1: Japanese Unexamined Patent Application, First Publication No. 2001-5967
Non-Patent Document 1: P Boldi, S Vigna: "Compressed perfect embedded skip lists for quick inverted-index look-ups", Proceedings of String Processing and Information Retrieval, 12th International Conference, pp. 1-15, 2005
Non-Patent Document 2: S Xue, Y Xu, B Oelmann: "Hybrid Golomb codes for a group of quantised GG sources", IEE Proceedings, Vision Image and Signal Processing, Vol. 150, No. 4, pp. 256-260, 2003

DISCLOSURE OF INVENTION

Problem to be Solved by the Invention

Although universal codes for efficiently encoding various kinds of general signal sources such as images and voices, which follow the normal distribution, there are no codes to which an assumption that the signal generation probability follows the normal distribution is applied, as shown in Non-Patent Document 1.

Therefore, encoding of a Gaussian signal by using the Golomb codes may be anticipated.

As described above, a signal which follows the exponential distribution can be efficiently encoded using codes; no table for the encoding and the decoding is necessary for the Golomb codes; the Golomb codes can be very easily processed and momentarily decoded; and further, any large integer input value can be encoded by the Golomb codes.

However, a signal generation probability of the exponential distribution is assigned as an assumption to the Golomb codes. Therefore, if a Gaussian signal is encoded using the Golomb codes, the encoding efficiency is considerably degraded in comparison with that of the Huffman codes or the arithmetic codes.

Therefore, conventionally, when encoding a Gaussian signal, the Huffman codes or the arithmetic codes are used.

However, when using the Huffman codes or the arithmetic codes, there are problems such that a frequency table, which is not required by the Golomb codes, is necessary; the input value range should be determined in advance; and the amount of processing is larger than the Golomb codes.

In consideration of the above problems, Non-Patent Document 2 proposes the Hybrid Golomb codes. However, this case requires a complex structure, and targets a distribution which is further steeper than the exponential distribution steeper than the normal distribution.

In addition, Non-Patent Document 1 gives priority to ease of the encoding process and uses the Golomb codes by optimizing the Golomb code parameter, without consideration of the encoding efficiency. However, in this case, the encoding efficiency is degraded in comparison with the Huffman codes or the arithmetic codes, and it is necessary to optimize the Golomb code parameter.

In light of the above circumstances, an object of the present invention is to provide novel information source encoding and decoding techniques for easily and efficiently encoding and decoding a Gaussian integer signal.

Means for Solving the Problem (1) Information Source Encoding Apparatus of the Present Invention In order to easily and efficiently encode a Gaussian integer signal, the information source encoding apparatus of the present invention includes (i) an input device for inputting a signal value sequence of a Gaussian integer signal as an encoding target; (ii) an integer pair conversion device for transforming signal values included in the signal value sequence (input by the input device) into integer pairs, each having two integers, arranged in the input order; (iii) a mapping device for regarding each of the integer pairs (obtained by the conversion of the integer pair conversion device) as a lattice point on two-dimensional coordinates, and obtaining integer values greater than or equal to zero by performing a two-dimensional-to-one-dimensional mapping in which the shorter the distance from each lattice point to the origin, the smaller the value assigned to the lattice point by the mapping; and (iv) an encoding device for encoding the integer values (obtained by the mapping device) using codes which are used for encoding an information source that follows an exponential distribution.

In the above structure, the encoding device may encode the integer values (obtained by the mapping device) using the Golomb codes which are suitable for encoding an information source which follows an exponential distribution. In such a case, in order to automatically set a Golomb code parameter, the apparatus may further include (i) a dispersion computing device for computing a dispersion of the signal values input by the input device; and (ii) a code parameter determination device for determining a code parameter of the Golomb codes, which has a value in proportion to the dispersion computed by the dispersion computing device.

The information source encoding apparatus of the present invention may have an encoding target which is an image signal indicating a Gaussian integer signal in such a case, the information source encoding apparatus of the present invention functions as an image signal encoding apparatus.

The information source encoding method of the present invention, which is implemented when the above devices operate, can also be implemented by a computer program. Such a computer program may be provided by storing it in an appropriate computer-readable storage medium, or by means of a network, and can be installed and operate on a control device such as a CPU so as to implement the present invention.

(2) Information Source Decoding Apparatus of the Present Invention

In order to decode encoded data generated by the information source encoding apparatus of the present invention, the information source decoding apparatus of the present invention includes (i) a decoding device for decoding the integer values by decoding the encoded data thereof, which is generated by the information source encoding apparatus of the present invention; (ii) a restoring device for restoring the integer pairs (which were mapped to obtain the integer values) by subjecting the integer values (decoded by the decoding device) to a one-dimensional-to-two-dimensional mapping, which is an inverse mapping of the two-dimensional-to-one-dimensional mapping used by the information source encoding apparatus of the present invention; and (iv) an output device for outputting integers which form each integer pair (restored by the restoring device) from the first element to the second element thereof.

For the above structure, if the information source encoding apparatus of the present invention generates the encoded data of the integer values by using the Golomb codes, the decoding device decodes the encoded data of the integer values by decoding the corresponding Golomb codes.

Also for the above structure, if the information source encoding apparatus of the present invention determines a code parameter of the Golomb codes, which has a value in proportion to a dispersion of signal values of the encoding target, then the decoding apparatus further includes a Golomb code parameter input device for inputting a Golomb code parameter as determined above, as the Golomb code parameter used for the decoding.

If the information source encoding apparatus of the present invention generates encoded data of an encoding target which is an image signal indicating a Gaussian integer signal, then the information source decoding apparatus of the present invention functions as an image signal decoding apparatus.

The information source decoding method of the present invention, which is implemented when the above devices operate, can also be implemented by a computer program. Such a computer program may be provided by storing it in an appropriate computer-readable storage medium, or by means of a network, and can be installed and operate on a control device such as a CPU so as to implement the present invention.

Effect of the Invention

As described above, in accordance with the present invention, it is possible to easily and efficiently encode and decode a Gaussian integer signal, which has not been able to be efficiently encoded using known Golomb codes or the like although a Gaussian integer signal appears in various scenes in mathematical and engineering fields.

In addition, generally, as an information source expands, the encoding efficiency of the relevant variable-length encoding is improved. The conversion between integer pairs and integers employed in the present invention is nothing but a two-dimensional expansion of the information source, and thus the encoding efficiency can be improved by the present invention.

BRIEF DESCRIPTION OF THE DRAWINGS

FIG. 5 is a diagram explaining the algorithm for implementing the two-dimensional-to-one-dimensional mapping performed in the present invention.

Figures 1, 2:
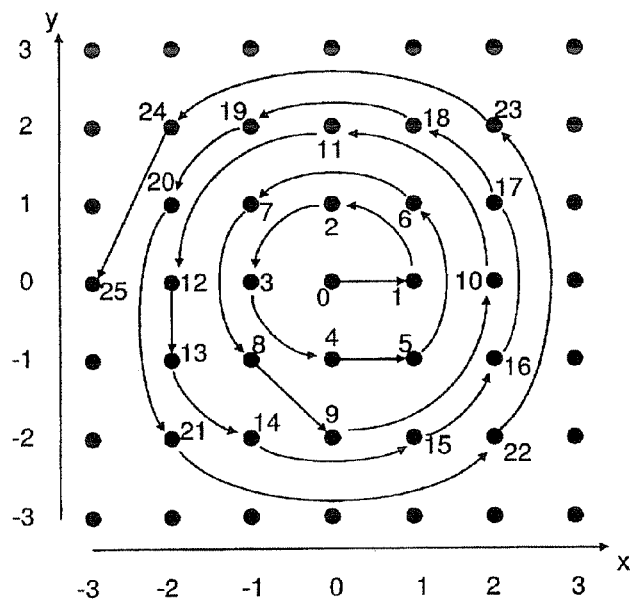
FIG. 1 is a diagram showing an example of the two-dimensional-to-one-dimensional mapping performed in the present invention.
FIG. 2 is a diagram explaining a table which stores corresponding relationships between integer pairs and integers.

REFERENCE SYMBOLS 1 information source encoding apparatus
2 information source decoding apparatus
10 signal input unit
11 integer pair conversion unit
12 two-dimensional-to-one-dimensional mapping unit
13 golomb encoder
20 encoded data input unit
21 golomb decoder
22 one-dimensional-to-two-dimensional inverse mapping unit
23 sequential output unit

BEST MODE FOR CARRYING OUT THE INVENTION

In the information source encoding method of the present invention, a Gaussian integer signal, which is input in the order of $a_1, a_2, a_3, a_4, \ldots$, is converted into integer pairs, each having two elements, such as $(a_1, a_2)$, $(a_3, a_4)$, in conformity of the input order. Each integer pair is represented by $(x,y)$.

Next, the integer pair $(x,y)$ is subjected to a two-dimensional-to-one-dimensional mapping in which the shorter the distance from each lattice point to the origin, the smaller the value assigned to the lattice point by the mapping, so that the corresponding integer (value) z (greater than or equal to 0) is obtained.

In accordance with such a two-dimensional-to-one-dimensional mapping, in which the shorter the distance from each lattice point to the origin, the smaller the value assigned to the lattice point, each integer pair $(x,y)$ is converted into integer z, as shown in FIG. 1.

The above mapping process can be performed by preparing a table (see FIG. 2), which stores corresponding relationships between the integer pairs and the integer values, in advance, and referring to the table using the integer pair $(x,y)$ as a key, thereby obtaining the integer z as the mapping result for the integer pair $(x,y)$ In contrast with a frequency table required when using the Huffman codes or the arithmetic codes, the above prepared table does not depend on the information source as the encoding target, and can be used generally.

In addition, the above mapping process can be performed by repeating (i) computing the minimum distance from the lattice point at the origin as the starting point to unprocessed lattice points (i.e., not yet arranged), and (ii) arranging each lattice point having the minimum distance from the origin in a specific order and assigning an individual integer value to each arranged lattice point, thereby obtaining the integer z as the mapping result for each integer pair $(x,y)$.

By using the above method, correspondence between each integer pair $(x,y)$ and each integer $(z)$ can be established without assuming the upper and lower limits of the signal value.

The information source encoding method of the present invention uses the two-dimensional-to-one-dimensional mapping, in which the shorter the distance from each lattice point to the origin, the smaller the value assigned to the lattice point, by the following reason.

The z value of the lattice point, which is distant from the origin by distance L, is approximately equal to the number of lattice points within a circle whose radius is L, and it is also approximately equal to the area of the circle, that is, "$z \cong \pi L^2$". This is a general approximation (the actual number of lattice points is very large), and "approximately equal" is effective when, for example, z is a few hundreds.

The probability for the lattice points can be originally represented using a normal distribution, that is, "$f \propto \exp(-aL^2)$" where a is a constant. Therefore, by using the above relationship "$z \cong \pi L^2$", an exponential distribution "$f \propto \exp(-az/\pi)$" for z is obtained.

Accordingly, a reversible mapping for converting a Gaussian signal source into a signal source of an exponential distribution is realized by the two-dimensional-to-one-dimensional mapping (used in the information source encoding method of the present invention) in which the shorter the distance from each lattice point to the origin, the smaller the value assigned to the lattice point.

Therefore, in the information source encoding method of the present invention, the integer z is obtained by applying the two-dimensional-to-one-dimensional mapping to the integer pair $(x,y)$, and then encoded using codes (e.g., Golomb codes) which are used for encoding an information source which follows the exponential distribution.

As described above, a signal which follows the exponential distribution can be efficiently encoding using the Golomb codes, where no code table is necessary for the relevant encoding and decoding, the Golomb codes can be very easily processed and momentarily decoded, and any large integer input value can be encoded.

Therefore, in accordance with the information source encoding method of the present invention, a Gaussian integer signal can be easily and efficiently encoded.

Also in the information source decoding method of the present invention, encoded data for integers, which is input as "$z_1, z_2, z_3, z_4, \ldots$", is decoded so that each integer value z, which has been encoded using the information source encoding method of the present invention, is decoded in the input order of the encoded data.

In the above process, if the encoded data for the integers is generated by the information source encoding method of the present invention which employs the Golomb codes, then the encoded data is subjected to Golomb decoding so as to obtain the decoded integer value.

Then, the decoded integer z is subjected to a one-dimensional-to-two-dimensional mapping, which is an inverse mapping of the two-dimensional-to-one-dimensional mapping used in the information source encoding method of the present invention, so that the integer pair $(x,y)$ (i.e., as the input of the first mapping) is restored.

When the two-dimensional-to-one-dimensional mapping used in the information source encoding method of the present invention is executed and then the decoded integer z is obtained, the above one-dimensional-to-two-dimensional mapping is performed by specifying the integer pair $(x,y)$ assigned to z.

Therefore, similar to the mapping process performed in the information source encoding method of the present invention, the one-dimensional-to-two-dimensional mapping can be performed by preparing a table (see FIG. 2), which stores corresponding relationships between the integer pairs and the integer values, in advance, and referring to the table using the integer z as a key, thereby obtaining the integer pair $(x,y)$ as the mapping result for the integer z.

In addition, the above mapping process can be performed by repeating (i) computing the minimum distance from the lattice point at the origin as the starting point to lattice points which have not yet been arranged, and (ii) arranging each lattice point having the minimum distance from the origin in a specific order and assigning an individual integer value to each lattice point, thereby obtaining the integer pair $(x,y)$ as the mapping result for each integer z.

In the next step of the information source decoding method of the present invention, the integer values x and y, which form the integer pair $(x,y)$, are output sequentially (x, and then y).

As described above, in accordance with the information source decoding method of the present invention, encoded data, which are obtained by encoding employing codes used for encoding an information source which follows the exponential distribution, are decoded so that a Gaussian integer signal can be easily and efficiently decoded.

Below, the present invention will be explained in detail in accordance with an embodiment in which a Gaussian signal source is converted into an exponential signal source by means of two-dimensional expansion and one-dimensional sequence formation of the Gaussian signal source, and the converted result is encoded using the Golomb codes suitable for the exponential signal source.

Figure 3:
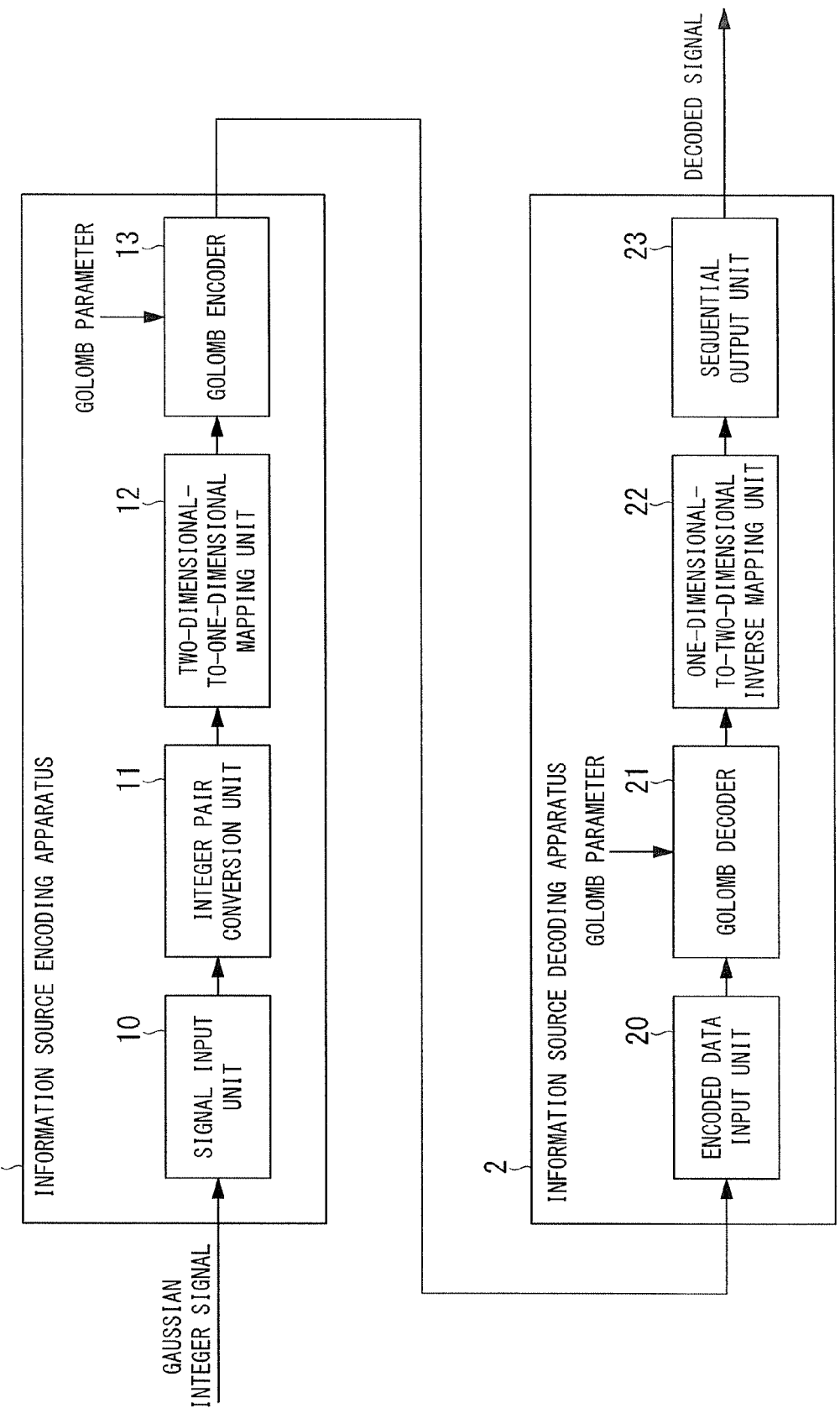
FIG. 3 shows the structure of an information source encoding apparatus and an information source decoding apparatus as embodiments of the present invention.

FIG. 3 shows the structure of an information source encoding apparatus 1 and an information source decoding apparatus 2 as embodiments of the present invention.

As shown in FIG. 1, the information source encoding apparatus 1 in accordance with the present invention includes a signal input unit 10 into which a signal value sequence of a Gaussian integer signal (as an encoding target) is input; an integer pair conversion unit 11 for converting the signal values (input through the signal input unit 10) into integer pairs (each having two elements), in the input order; a two-dimensional-to-one-dimensional mapping unit 12 for applying a two-dimensional-to-one-dimensional mapping to the integer pairs obtained by the conversion of the integer pair conversion unit 11, where in the mapping, the shorter the distance from each lattice point to the origin, the smaller the value assigned to the lattice point, thereby obtaining integer values greater than or equal to zero; and a Golomb encoder 13 for encoding the integer values obtained by the two-dimensional-to-one-dimensional mapping unit 12 by using the Golomb codes.

On the other hand, the information source decoding apparatus 2 in accordance with the present invention includes an encoded data input unit 20 into which encoded data for integer values is input; a Golomb decoder 21 for subjecting the encoded data, which has been input through the encoded data input unit 20, to Golomb decoding so as to restore the integer values; a one-dimensional-to-two-dimensional inverse mapping unit 22 for restoring integer pairs when the mapping process was executed by the two-dimensional-to-one-dimensional mapping unit 12 in the information source encoding apparatus 1 in accordance with the present invention, and the integer values decoded by the Golomb decoder 21 have been obtained, where the integer pairs restored by the unit 22 correspond to the input of the two-dimensional-to-one-dimensional mapping for generating the integer values decoded by the Golomb decoder 21, and are restored by specifying integer pairs corresponding to the decoded integer values; and a sequential output unit 23 for outputting integers, which form the integer pairs restored by the one-dimensional-to-two-dimensional inverse mapping unit 22, in the order from the first element to the second element of each pair.

Figure 4:
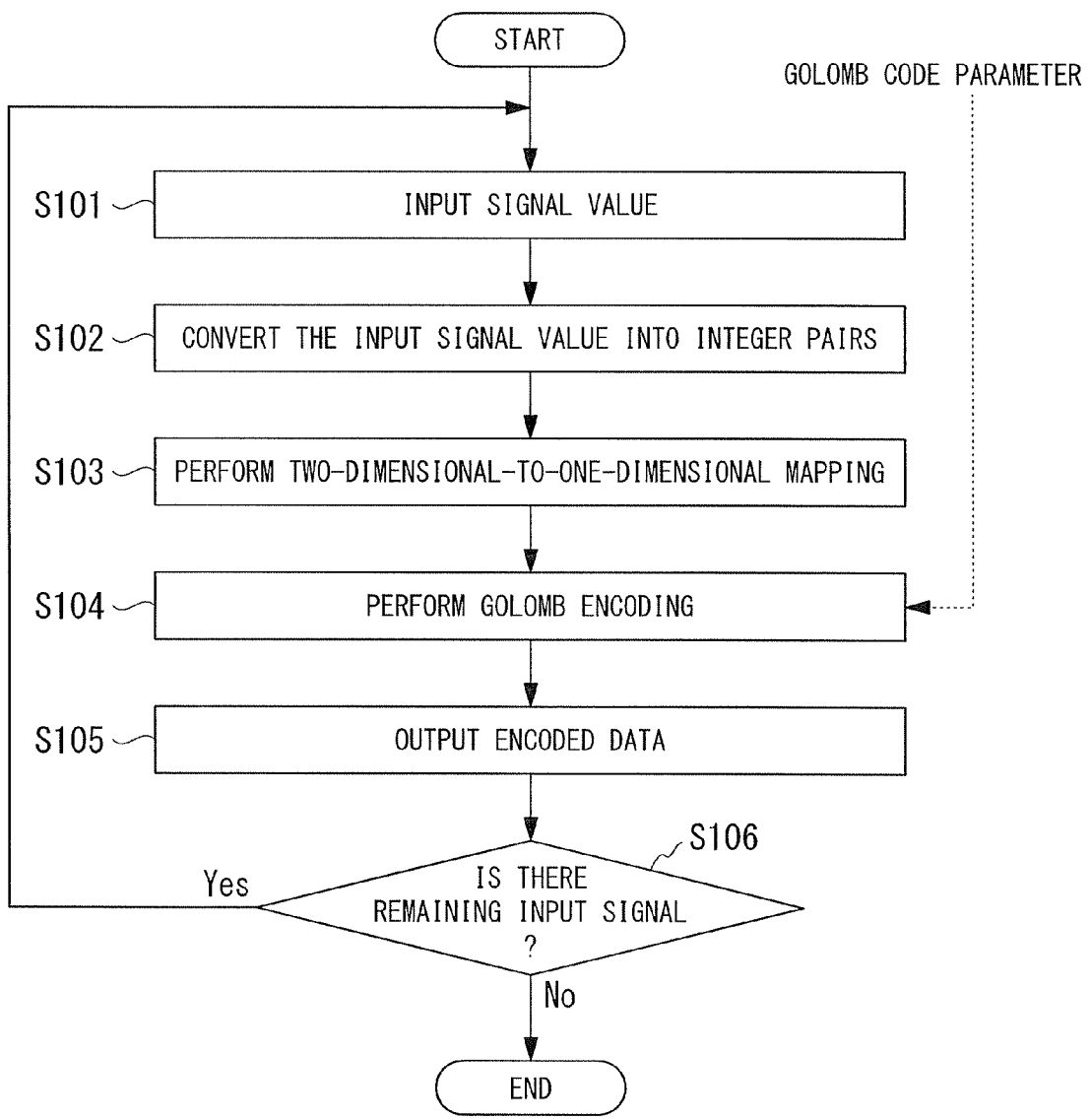
FIG. 4 shows a flowchart executed by the information source encoding apparatus of the embodiment.

FIG. 4 shows an example of the flowchart executed by the information source encoding apparatus 1 having the above-described structure in accordance with the present invention.

Referring to the flowchart, the process executed by the information source encoding apparatus 1 based on the present invention will be explained in detail.

In the information source encoding apparatus 1 based on the present invention, in the first step S101, signal values of a Gaussian integer signal are input by each pair of two elements from the head of the signal.

In the next step S102, the Gaussian integer signal, which is input in the order of $a_1$, $a_2 \to a_3$, $a_4 \to$, ..., is converted into integer pairs, each having two elements, such as $(a_1, a_2)$, $(a_3, a_4)$, in conformity of the input order. Each integer pair is represented by (x,y).

In the next step S103, the integer pair (x,y) is subjected to a two-dimensional-to-one-dimensional mapping in which the shorter the distance from each lattice point to the origin, the smaller the value assigned to the lattice point by the mapping, so that the corresponding integer (value) z (greater than or equal to 0) is obtained.

In the next step S104, the integer z is subjected to Golomb encoding by using a Golomb code parameter g which is provided separately, and in the next step S105, the obtained encoded data is output.

In the next step S106, it is determined whether or not the inputting of the Gaussian integer signal has been completed. If it has not yet been completed, the operation returns to step S101 again, while if it has been completed, the operation is ended.

In the above, the Golomb code parameter g is provided separately. However, the statistical characteristics of the input signal may be researched in advance, and the parameter g may be appropriately determined based on the research result.

For example, if the input signal has a dispersion $\sigma^2$, then the Golomb code parameter g can be defined by:

$$g = (2 \cdot \log_e 2) \cdot \pi \cdot \sigma^2$$

where g is appropriately rounded off.

Figures 20, 21:
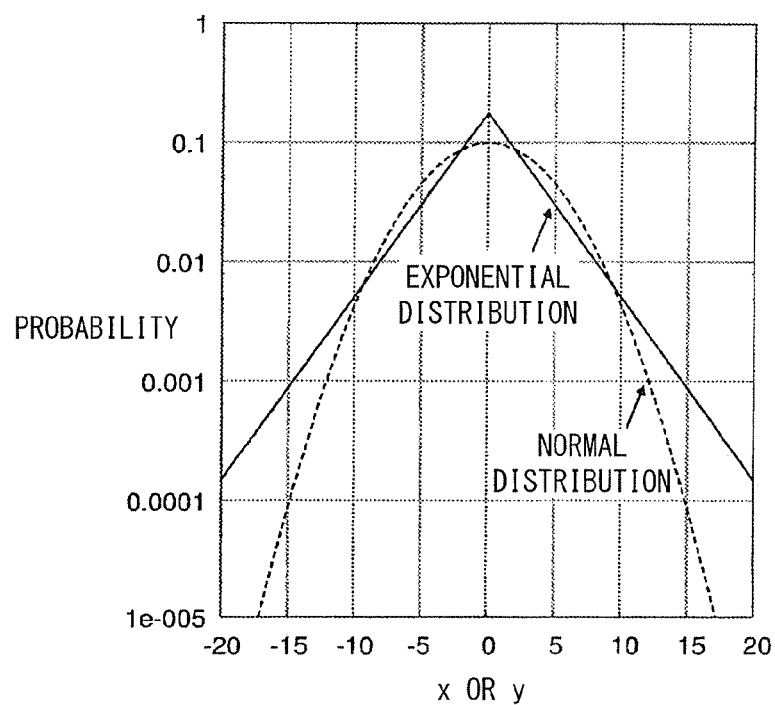
FIG. 20 is a diagram explaining the Golomb codes.
FIG. 21 is a diagram explaining the normal distribution and the exponential distribution.

As above-explained by referring to FIG. 20, when performing the encoding using the Golomb codes, a large value of the Golomb code parameter g is suitable for encoding a gentle distribution, while a small value of the Golomb code parameter g is suitable for encoding a steep distribution which converges at zero. Therefore, when the Golomb code parameter g is defined in accordance with such a rule, an appropriate value of the Golomb code parameter g can be automatically determined.

Below, the two-dimensional-to-one-dimensional mapping performed in step S103 will be explained.

In the two-dimensional-to-one-dimensional mapping (see the example in FIG. 1), the shorter the distance from each lattice point to the origin, the smaller the integer value z assigned to the lattice point. Therefore, the one-dimensional-to-two-dimensional inverse mapping for the first nine z values are shown in FIG. 2.

Generally, there are a plurality of lattice points having the same distance from the origin. However, any numbering method can be applied to such lattice points. As shown in FIG. 1, numbering along a counterclockwise rotation from the start to the end may be performed. However, any numbering method based on a uniform rule can be used so that the encoder side can perform the corresponding inverse conversion.

In addition, although it is necessary to assume the upper and lower limits of the input values x and y, an appropriate table as shown in FIG. 2 may be prepared in advance, so that two-dimensional expansion, one-dimensional sequence formation, and inverse processes thereof can easily be performed only by referring to the table.

For practical use, the upper and lower limits of the input values can be assumed in most cases. For example, if a differential signal for an 8-bit image is targeted, then it is possible that $-255 \leq x$ and $y \leq 255$. In this case, a table having 261,121 elements is provided, where:

$$(255-(-255)+1)^2 = 511^2 = 261{,}121$$

Even when the upper and lower limits of the input values cannot be assumed, infinite correspondence between (x,y) and z is possible by arranging the lattice points in the order of closeness to the origin unlimitedly by using pseudo-codes generated by an algorithm as shown in FIG. 5. The algorithm will be explained in detail later.

In FIG. 5, l(x,y) indicates the distance between the origin and point (x,y), where a Euclidean distance is generally used as the distance:

$$l(x,y) = (x^2 + y^2)^{1/2}$$

Instead, a squared Euclidean distance, which can be more easily processed, may be used, and produces the same numbering result:

$$l(x,y) = x^2 + y^2$$

In addition, distance function l(x,y) may not be isotropic. If the elements of the input Gaussian information source are not strictly iid (independent and identically distributed) and there is a correlation therebetween, then the following formula may be used by employing an appropriate constant α:

$$l(x,y)=x^2+y^2+\alpha xy$$

where α<0 when there is a positive correlation between x and y, and α>0 when there is a negative correlation between x and y.

Additionally, in accordance with the shape of the two-dimensional distribution of the input signal pairs, L1 norm such as:

$$l(x,y)=|x|+|y|$$

may be used, or more generally, the following Lγ norm (the γ power of each signal element) may be used:

$$l(x,y)=|x|^\gamma+|y|^\gamma$$

Below, results of an experiment performed for verifying the effectiveness of the present invention will be shown.

Figure 6:
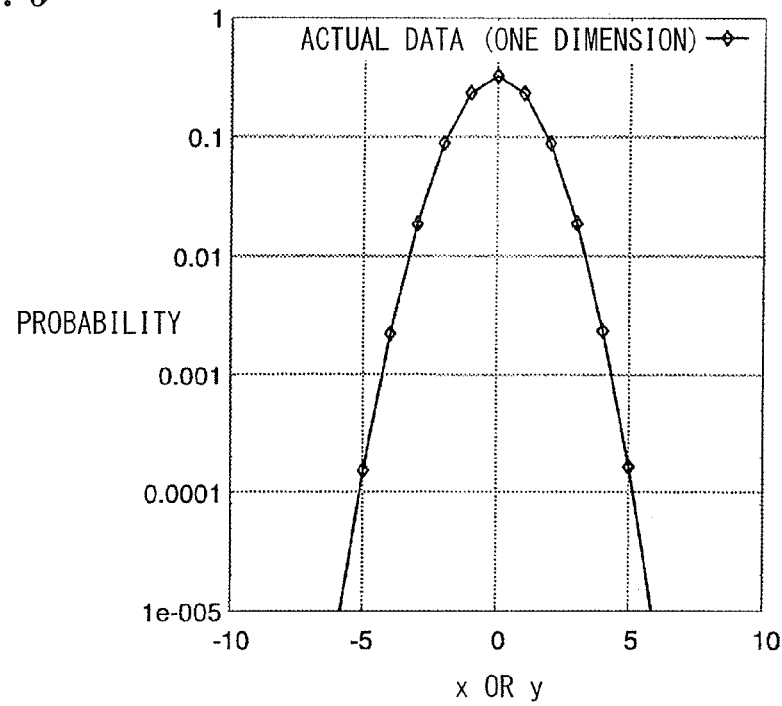
FIG. 6 is a diagram showing results of an experiment performed for verifying the effectiveness of the present invention.

FIG. 6 shows the frequency distribution of a signal source which is very close to a Gaussian signal obtained by processing an actual image. The vertical axis shows logarithm of the relevant probability. It is obvious that the frequency distribution of the current signal source has a parabolic form, that is, it follows a normal distribution.

Figure 7:
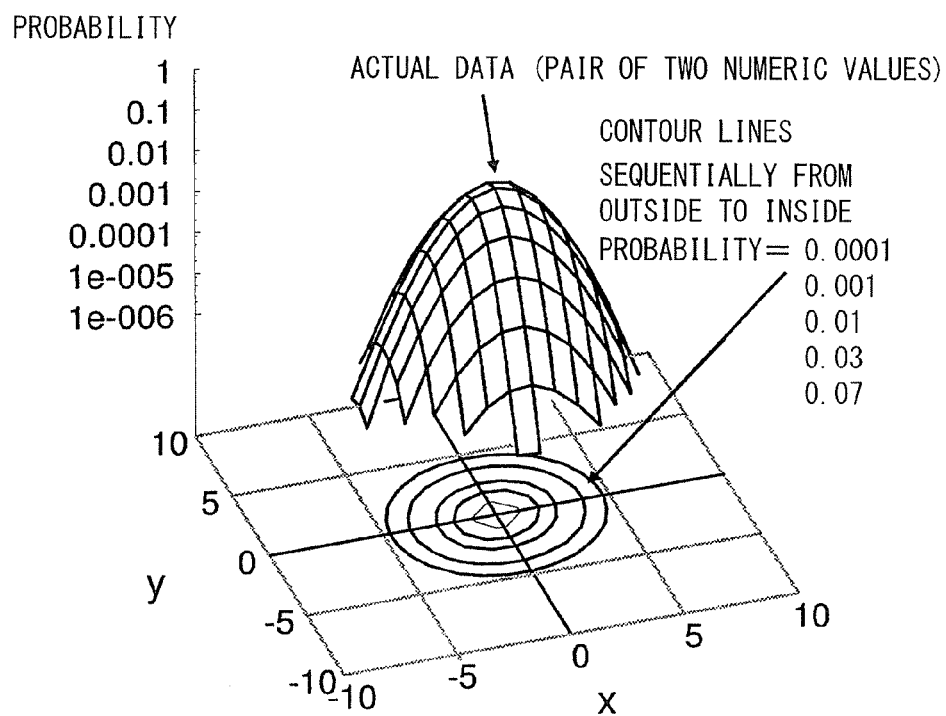
FIG. 7 is also a diagram showing results of an experiment performed for verifying the effectiveness of the present invention.

FIG. 7 is a graph obtained by sequentially extracting the elements of the above signal source as pairs of two numerical values (x,y), and representing the frequency distribution thereof in a three-dimensional form. Similarly, the vertical axis shows logarithm of the relevant probability. The graph shows a paraboloid of revolution formed by revolving a parabola.

Figure 8:
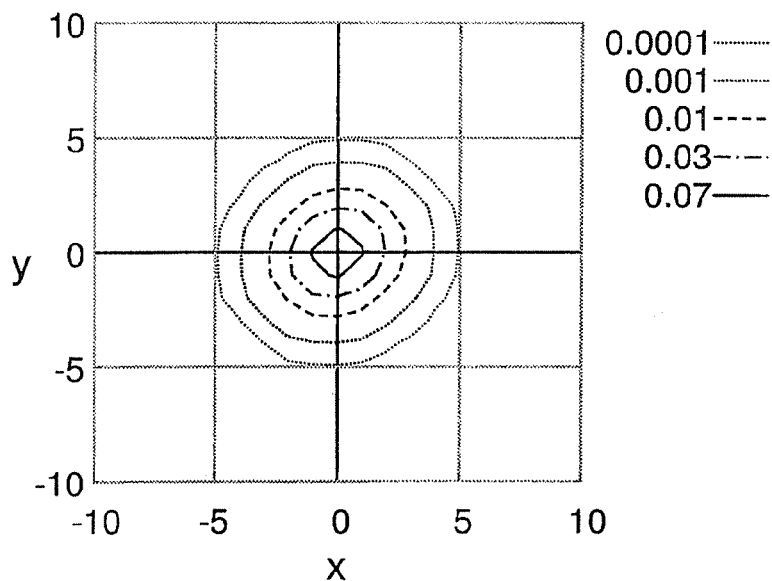
FIG. 8 is also a diagram showing results of an experiment performed for verifying the effectiveness of the present invention.

FIG. 8 shows contour lines of the paraboloid of revolution. The contour lines are almost concentric although a slight positive correlation is observed therebetween.

In the graph having a vertical logarithm scale, the exponential distribution shows a triangular form as shown in FIG. 21. However, after the signal is converted to have a one-side distribution by means of the above-described formulas:

$$b=2a-1 \text{ when } a>0$$

$$b=-2a \text{ when } a \leq 0,$$

a straight line downward to the right is obtained.

Figure 9:
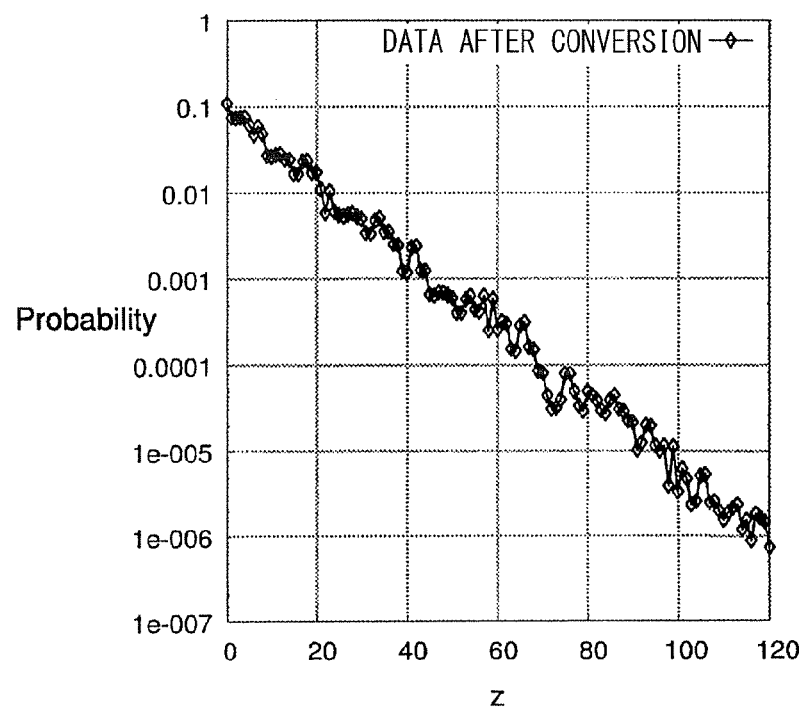
FIG. 9 is also a diagram showing results of an experiment performed for verifying the effectiveness of the present invention.

FIG. 9 shows a frequency distribution of one-dimensional value z, which is obtained by subjecting the value pair (x,y) to a two-dimensional-to-one-dimensional mapping in accordance with the present invention, in a vertical logarithm scale similar to FIG. 6.

The graph shows an almost straight line downward to the right, which indicates that the distribution almost coincides with an exponential distribution. Therefore, efficient encoding using the Golomb codes can be anticipated.

The actual encoding results will be shown below. The employed information source includes 13,509,440 samples, and the amount of information computed by means of entropy is 64,035,731 (bits). This is a theoretical value, and the amount of code generated by actual encoding always exceeds the value.

The above information source was subjected to a two-dimensional-to-one-dimensional mapping in accordance with the present invention, and the result represented by means of the Golomb code parameter g=7 was 64,503,706 (bits), so that the encoding could be performed with a code-amount increase of 0.73% (i.e., encoding efficiency of 0.9927).

In a conventional method performed as a comparative example, the same information source was subjected to Golomb encoding with no specific mapping, where the Golomb codes at g=1 produced the minimum result, which was 68,898,893 (bits) (i.e., encoding efficiency of 0.9294).

The other four types of data were subjected to similar experiments.

Figure 10:
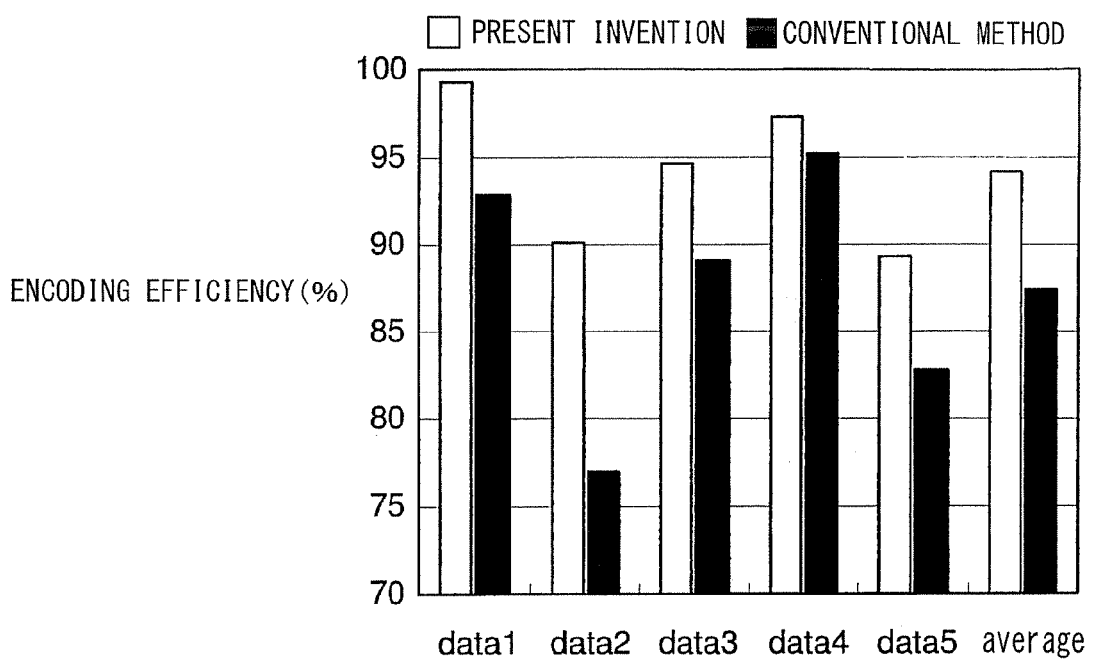
FIG. 10 is also a diagram showing results of an experiment performed for verifying the effectiveness of the present invention.

FIG. 10 shows compared encoding efficiencies obtained by the experiments. Among data1 to data5 in FIG. 10, data1 corresponds to the above-described result. The encoding efficiency of the present invention was always 90% or higher. Regarding the average of the encoding efficiency, the present invention had an average of 94.1% while the conventional method had an average of 87.4%, so that there was approximately a 7-point difference between them.

Accordingly, the effectiveness of the encoding process performed by the information source encoding apparatus 1 in accordance with the present invention could be verified, where the information source encoding apparatus 1 encodes a Gaussian integer signal based on the flowchart of FIG. 4.

Figure 11:
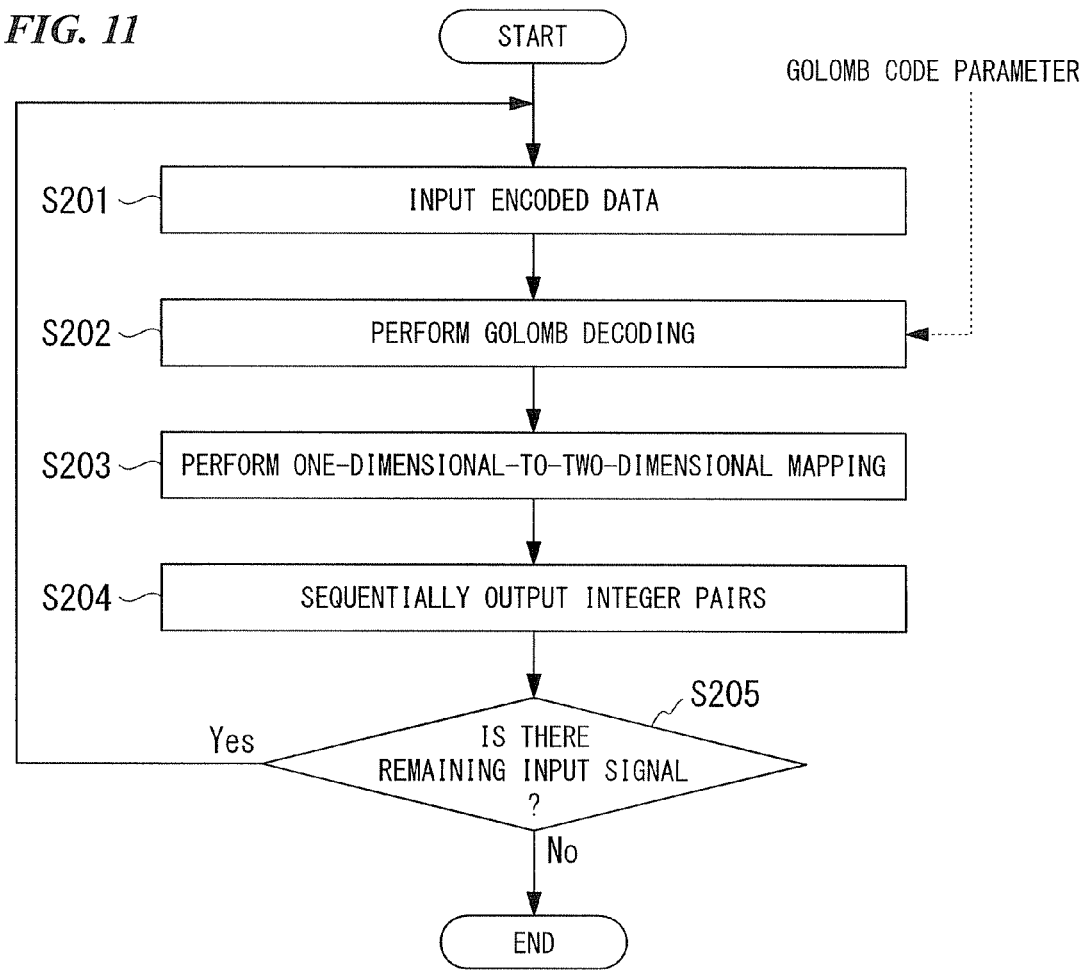
FIG. 11 shows a flowchart executed by the information source decoding apparatus of the embodiment.

FIG. 11 shows an example of the flowchart executed by the information source decoding apparatus 2 having the structure shown in FIG. 3, in accordance with the present invention.

Referring to the flowchart, the process executed by the information source decoding apparatus 2 based on the present invention will be explained in detail.

In the information source decoding apparatus 2 based on the present invention, in the first step S201, elements of encoded data (Golomb codes of integer values z) generated by the information source encoding apparatus 1 based on the present invention are input one by one from the head of the encoded data.

In the next step S202, the input Golomb codes are decoded using the Golomb code parameter g, so as to obtain integer values z greater than or equal to zero.

In the next step S203, the integer values z are subjected to a one-dimensional-to-two-dimensional mapping so as to map the integers z into integer pairs (x,y). In the next step S204, each integer pair (x,y) is output in order from x to y.

When the two-dimensional-to-one-dimensional mapping used in the information source encoding apparatus 1 based on the present invention is executed and then the decoded integer z is obtained, the one-dimensional-to-two-dimensional mapping in step S203 is performed by specifying the integer pair (x,y) assigned to z.

In the next step S205, it is determined whether or not the inputting of the Golomb codes has been completed. If it has not yet been completed, the operation returns to step S201 again, while if it has been completed, the operation is ended.

Concrete Embodiments

Below, concrete embodiments of the processes executed in steps S102 and S103 in the flowchart of FIG. 4 and the processes executed in steps S203 and S204 in the flowchart of FIG. 11 will be shown.

(1) Concrete Embodiment of the Process Executed in Step S102 in the Flowchart of FIG. 4

Figure 12:
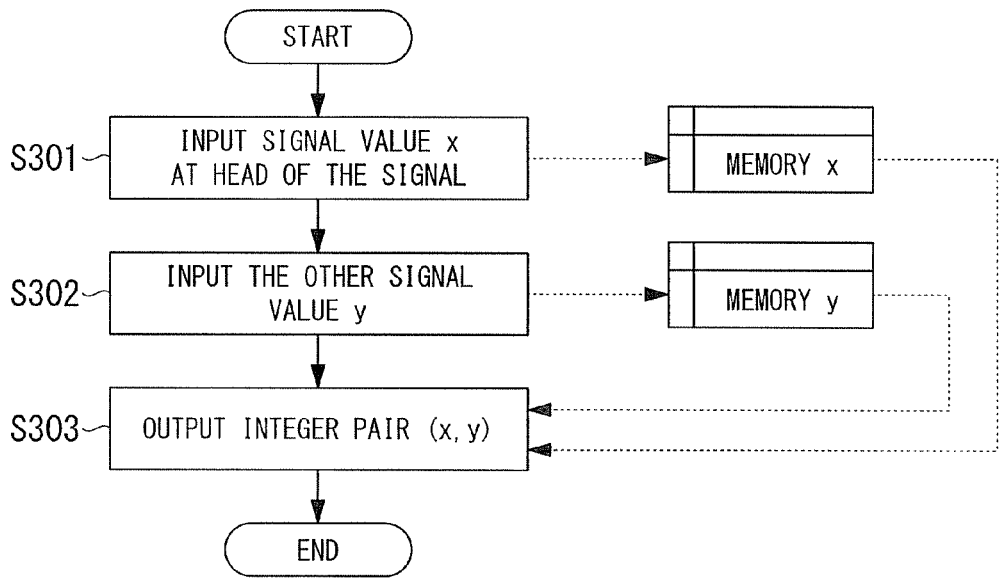
FIG. 12 shows a detailed flowchart executed by the information source encoding apparatus of the embodiment.

FIG. 12 shows a detailed flowchart of the process executed in step S102 in the flowchart of FIG. 4.

In the relevant step S102, when receiving the two signal values of a Gaussian integer signal, which are input through step S101, in the first step S301 of the flowchart of FIG. 12, the signal value x at the head of the received data is stored in memory x, and in the next step S302, the other signal value y of the received data is stored in memory y.

In the next step S303, the signal values x and y are respectively retrieved from the memories x and y, and are output as an integer pair (x,y).

Accordingly, in step S102, the flowchart of FIG. 12 is executed so that the values in the signal sequence of a Gaussian integer signal are output two by two as pairs.

(2) Concrete Embodiment of the Process Executed in Step S103 in the Flowchart of FIG. 4

FIGS. 13 to 16 show detailed flowcharts of the process executed in step S102 in the flowchart of FIG. 4.

In the relevant step S103, the two-dimensional-to-one-dimensional mapping implemented by the algorithm shown in FIG. 5 is performed so as to map the integer pair (x,y) into the integer z, and the integer z is then output.

Figure 13:
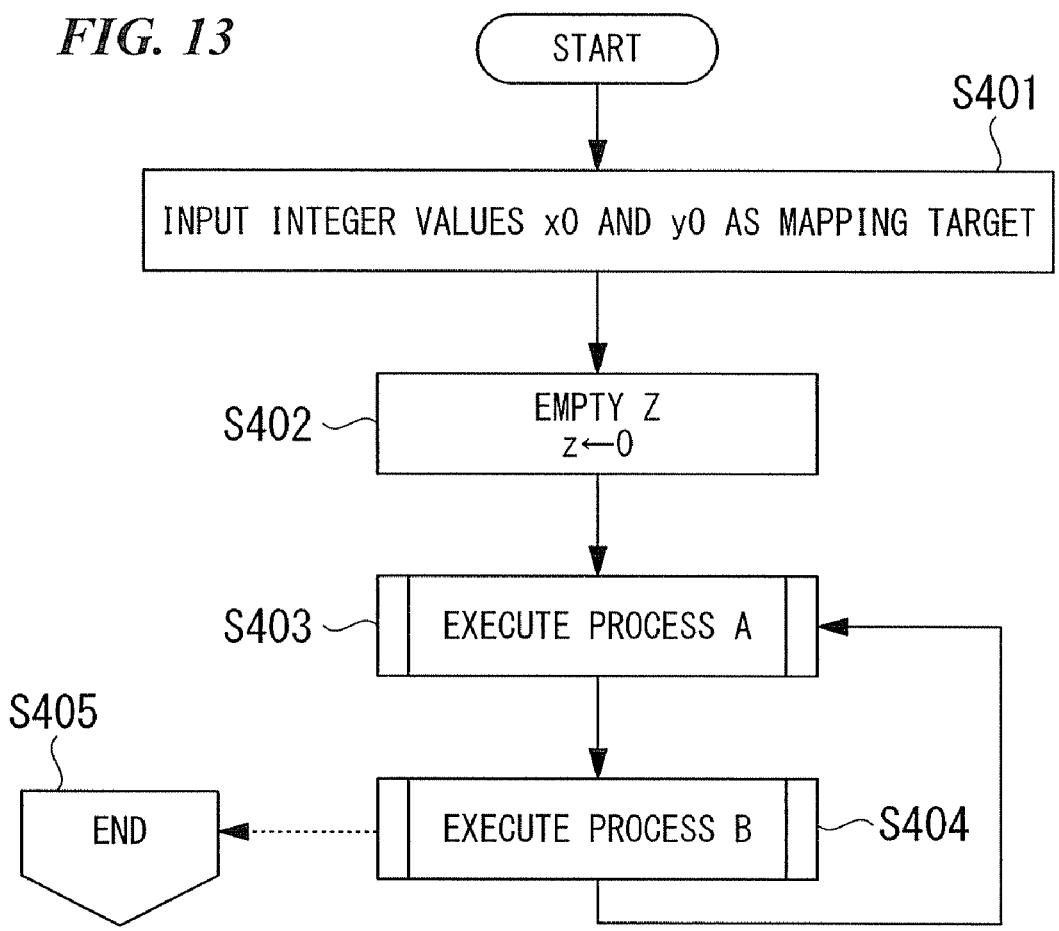
FIG. 13 also shows a detailed flowchart executed by the information source encoding apparatus of the embodiment.

That is, as shown in the flowchart of FIG. 13, in the first step S401, the integer values x0 and y0 as the mapping target are input, and in the next step S402, a lattice point storage memory Z is emptied and a variable z is initialized to 0.

Figure 14:
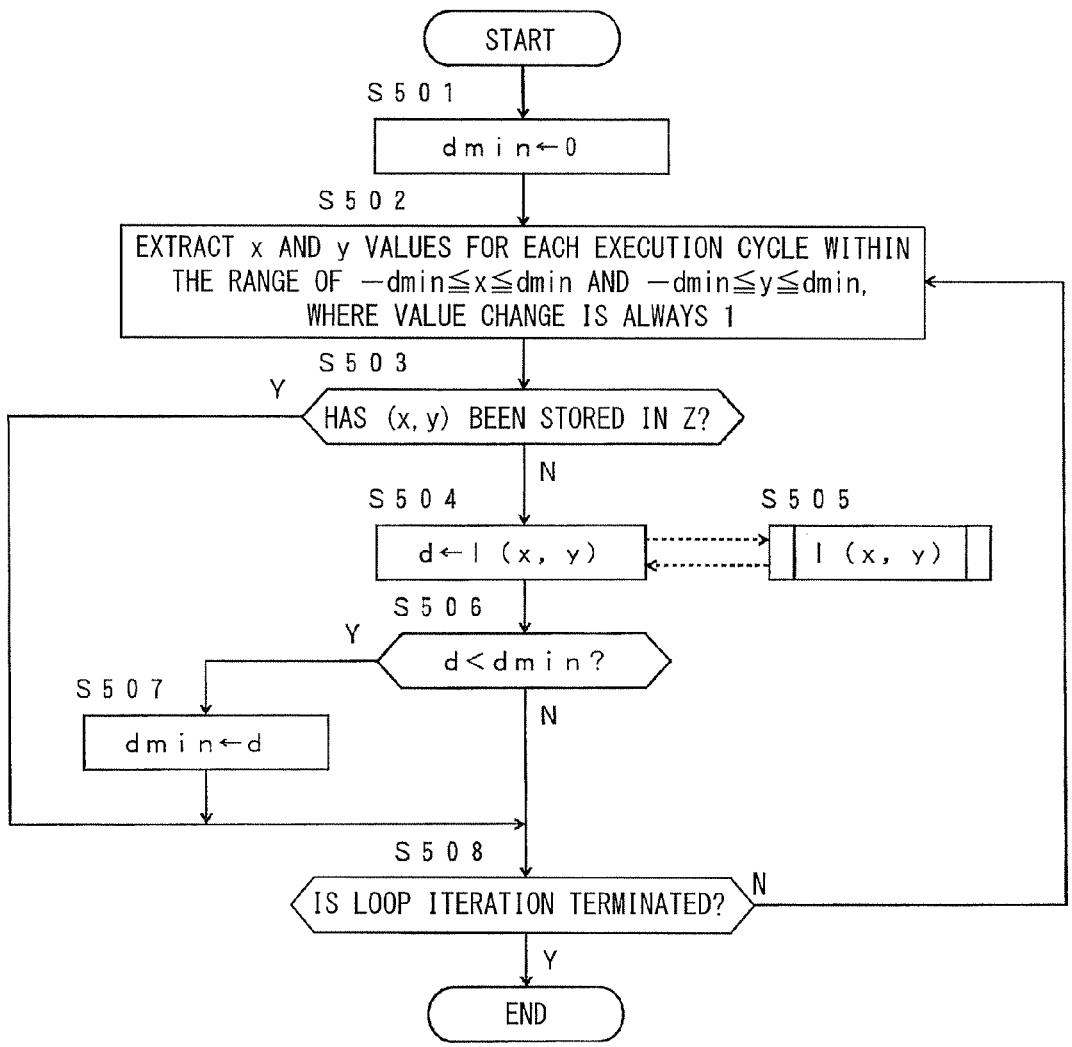
FIG. 14 also shows a detailed flowchart executed by the information source encoding apparatus of the embodiment.
Figure 15:
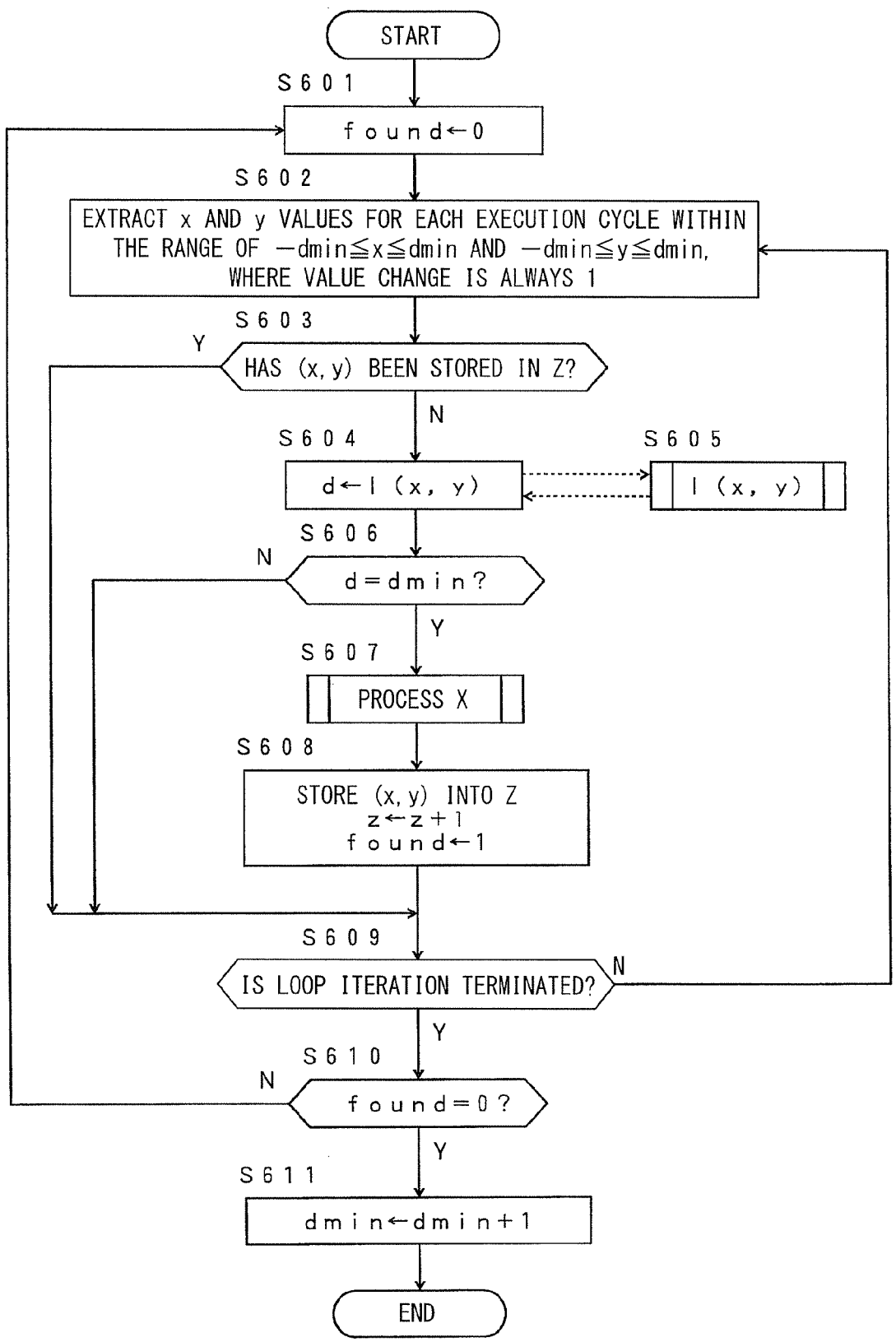
FIG. 15 also shows a detailed flowchart executed by the information source encoding apparatus of the embodiment.

In the next step S403, a process A defined by a flowchart of FIG. 14 is executed, and in the next step S404, a process B defined by a flowchart of FIG. 15 is executed.

Figure 16:
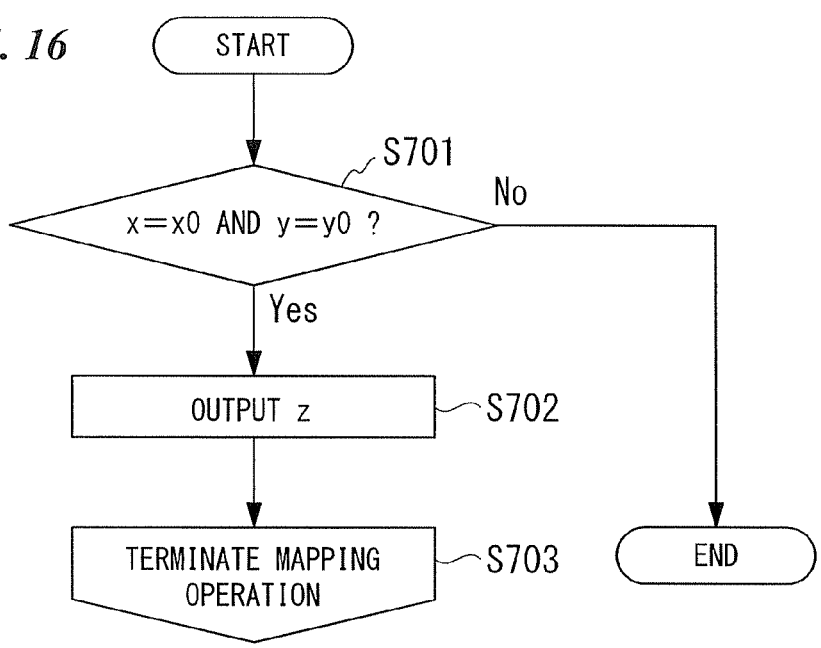
FIG. 16 also shows a detailed flowchart executed by the information source encoding apparatus of the embodiment.

In the process B, a process X defined by a flowchart of FIG. 16 is executed. In the process X, if a condition is satisfied, it is determined that an integer z as the mapping result of the integer pair (x0,y0) has been obtained, and the integer z is output. The operation then proceeds to step S405, and is ended.

In contrast, if the condition is not satisfied, no data is output and the operation returns to step S403, that is, the process A.

Although the processes A, B, and X will be explained in detail, a brief explanation therefor is such that in the process A, for lattice points (x,y) which had not yet been arranged and yet had an assigned integer, the minimum value dmin of the distance between the origin and each lattice point is computed, where "$-dmin \leq x \leq dmin$" and "$-dmin \leq y \leq dmin$", which are set in the process B. Generally, a plurality of lattice points prodide the minimum value dmin.

Therefore, in the process B, each of such lattice points is extracted in accordance with a specific extraction order, and an integer value is assigned to each extracted lattice point while the assigned integer value is incremented by one for each assignment.

For the above assignment in the process X, it is determined whether or not the input (x0,y0) has appeared as a lattice point (x,y). If it is determined that (x0,y0) has appeared, the integer z assigned to the relevant lattice point (x,y) is determined as the mapping result. If it is determined that (x0,y0) has not yet appeared, dmin is incremented by one in the process B, so that a similar operation is repeated until the input (x0,y0) appears.

Below, the process A will be explained with reference to the flowchart of FIG. 14.

In the process A, among the lattice points (x,y) in a two-dimensional range where each of x and y is greater than or equal to −dmin, and is also smaller than or equal to dmin (dmin is an integer incremented by one in the process B), those which have not yet been arranged are set as processing targets, and the minimum value of the distance from the origin is computed for the targets.

In the first step S501, the integer value dmin is initialized to 0. In the next step S502, one set of x and y values is generated for each execution cycle (from S502 to S508) within the range of "$-dmin \leq x \leq dmin$" and "$-dmin \leq y \leq dmin$" in accordance with a specific value-selection order, where the value change is always 1.

In the next step S503, it is determined whether or not the generated set (x,y) has been stored in the lattice point storage memory Z. If it has been already stored, the operation proceeds to step S508, and if it has not yet been stored, the operation proceeds to step S504. In step S504, a variable d is set to the distance l(x,y) between the lattice point (x,y) and the origin, which is computed by the process of step S505.

The distance l(x,y) may be computed using the following function:

$$l(x,y) = x^2 + y^2$$

In the next step S506, the values of d and dmin are compared with each other. If d is greater than or equal to dmin, the operation immediately proceeds to step S508. If d is smaller than dmin, the operation proceeds to step S507 where dmin is set to d, and then proceeds to step S508.

In step S508, it is determined whether or not all possible combinations between x and y have appeared within the range of "$-dmin \leq x \leq dmin$" and "$-dmin \leq y \leq dmin$". If they have not yet appeared, the operation returns to step S502, and if they have already appeared, the process A is completed.

Below, the process B will be explained with reference to the flowchart of FIG. 15.

In the process B, among the lattice points (x,y) in a two-dimensional range where each of x and y is greater than or equal to −dmin, and is also smaller than or equal to dmin (dmin is an integer incremented by one), those which have not yet been arranged and satisfy "$l(x,y) = dmin$" (dmin is obtained through the process A) are subjected to the process X in the flowchart of FIG. 16.

In the first step S601, a flag "found" is set to 0. In the next step S602, one set of x and y values is generated for each execution cycle (from S602 to S609) within the range of "$-dmin \leq x \leq dmin$" and "$-dmin \leq y \leq dmin$" in accordance with a specific value-selection order, where the value change is always 1.

In the next step S603, it is determined whether or not the generated set (x,y) has been stored in the lattice point storage memory Z. If it has been already stored, the operation proceeds to step S609, and if it has not yet been stored, the operation proceeds to step S604. In step S604, a variable d is set to the distance l(x,y) between the lattice point (x,y) and the origin, which is computed by the process of step S605.

The distance l(x,y) may be computed using the following function:

$$l(x,y) = x^2 + y^2$$

In the next step S606, the values of d and dmin are compared with each other. If d does not coincide with dmin, the operation immediately proceeds to step S609. If d coincides with dmin, the operation proceeds to step S607 where the process X is executed.

In step S608, the integer pair (x,y) is stored into the lattice point storage memory Z; the integer value z (which is defined separately) is incremented by one; and the value of flag "found" is set to 1. The operation then proceeds to step S609.

In step S609, it is determined whether or not all possible combinations between x and y have appeared within the range of "$-dmin \leq x \leq dmin$" and "$-dmin \leq y \leq dmin$". If they have not yet appeared, the operation returns to step S602, and if they have already appeared, the operation proceeds to step S610. In step S610, it is determined whether or not the value of flag "found" is equal to 0.

In accordance with the determination of step S610, when it is determined that the value of flag "found" is not equal to 0, the operation returns to step S601, and when it is determined that the value of flag "found" is equal to 0, the operation proceeds to step S611. In step S611, the value of dmin is incremented by one, and the process B is ended.

Below, the process X will be explained with reference to the flowchart of FIG. 16.

In the process X, when the values x0 and y0, which were input as the mapping target, become equal to the values x and y, which is now processed in the relevant loop, a one-dimensional mapped value z corresponding thereto is output.

In the first step S701, it is determined whether or not x=x0 and y=y0. If it is determined that x=x0 and y=y0, the operation proceeds to step S702, where an integer value z assigned to (x,y) is output as the mapping result. The operation then proceeds to step S703, where the two-dimensional-to-one-dimensional mapping operation is terminated. In contrast, if it is determined that the condition "x=x0 and y=y0" is not satisfied, the process X is ended (i.e., the operation returns to step S608 in the process B).

Accordingly, by executing the flowcharts of FIGS. 13 to 16, in step S103 of FIG. 4, the two-dimensional-to-one-dimensional mapping implemented by the algorithm shown in FIG. 5 is performed so as to map the integer pair (x,y) into the integer z, and the integer z is then output.

(3) Concrete Embodiment of the Process Executed in Step S203 in the Flowchart of FIG. 11

Figure 17:
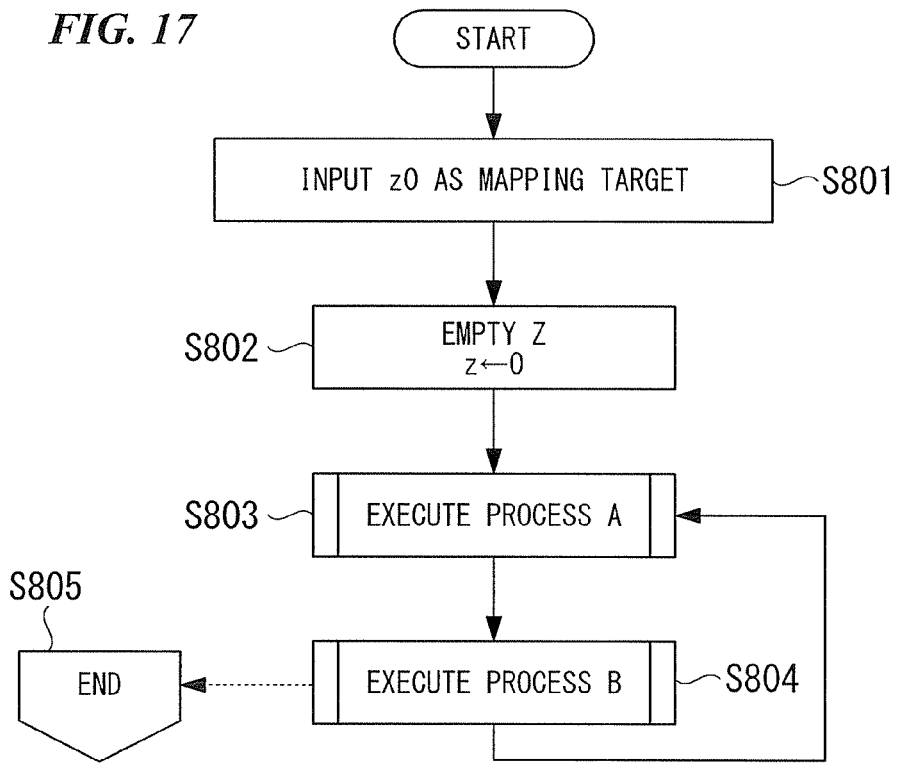
FIG. 17 shows a detailed flowchart executed by the information source decoding apparatus of the embodiment.
Figure 18:
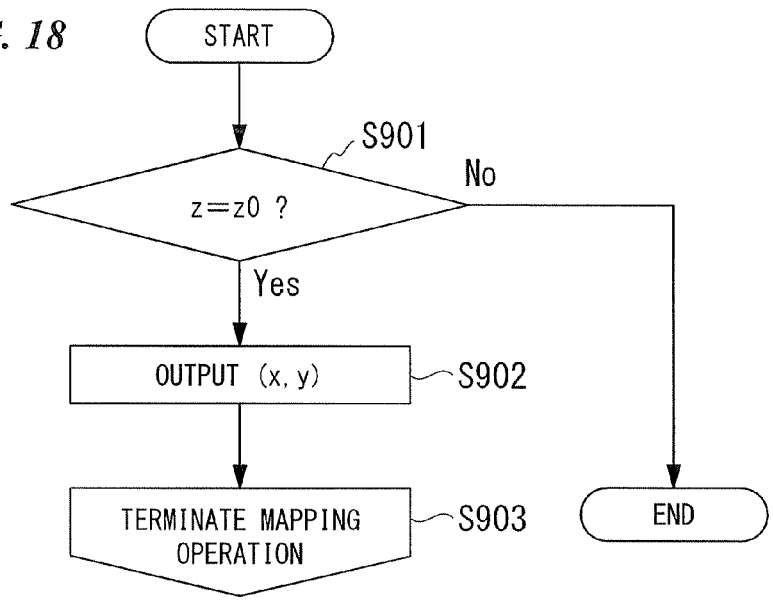
FIG. 18 also shows a detailed flowchart executed by the information source decoding apparatus of the embodiment.

FIGS. 17 and 18 show detailed flowcharts of the process executed in step S203 in the flowchart of FIG. 11.

In step S203, the one-dimensional-to-two-dimensional mapping implemented by the algorithm shown in FIG. 5 is performed so as to map the integer z (decoded through the process of step S202) into the integer pair (x,y), and the integer pair (x,y) is then output.

Specifically, as shown in the flowchart of FIG. 17, in the first step S801, the integer value z0 as the mapping target is input. In the next step S802, the lattice point storage memory Z is emptied and the variable z is initialized to 0.

In the next step S803, the process A decided by the flowchart of FIG. 14 is executed, and in the next step S804, the process B decided by the flowchart of FIG. 15 is executed (however, the process X is modified to a process X' as explained below).

That is, in the process B, the process X' defined by a flowchart in FIG. 18 is executed. In the process X', if a condition is satisfied, it is determined that an integer pair (x,y) as the mapping result of the integer z0 has been obtained, and the integer pair (x,y) is output. The operation then proceeds to step S805, and is ended.

In contrast, if the condition is not satisfied, no data is output and the operation returns to step S803, that is, the process A.

Below, the process X' will be explained with reference to the flowchart of FIG. 18.

In the process X', when the value z0, which was input as the mapping target, becomes equal to the value z, which is now processed in the relevant loop, two-dimensional mapped values (x,y) corresponding thereto are output.

In the first step S901, it is determined whether or not z=z0. If it is determined that z=z0, the operation proceeds to step S902, where integer values (x and y) assigned to the integer z are output as the mapping result. The operation then proceeds to step S903, and the one-dimensional-to-two-dimensional mapping operation is terminated. In contrast, if it is determined that z≠z0, the process X' is ended (i.e., the operation returns to step S608 in the process B).

Accordingly, by executing the flowcharts of FIGS. 17 to 18, in step S203 of FIG. 11, the one-dimensional-to-two-dimensional mapping implemented by the algorithm shown in FIG. 5 is performed so as to map the integer z into the integer pair (x,y), and the integer pair (x,y) is then output.

(4) Concrete Embodiment of the Process Executed in Step S204 in the Flowchart of FIG. 11

Figure 19:
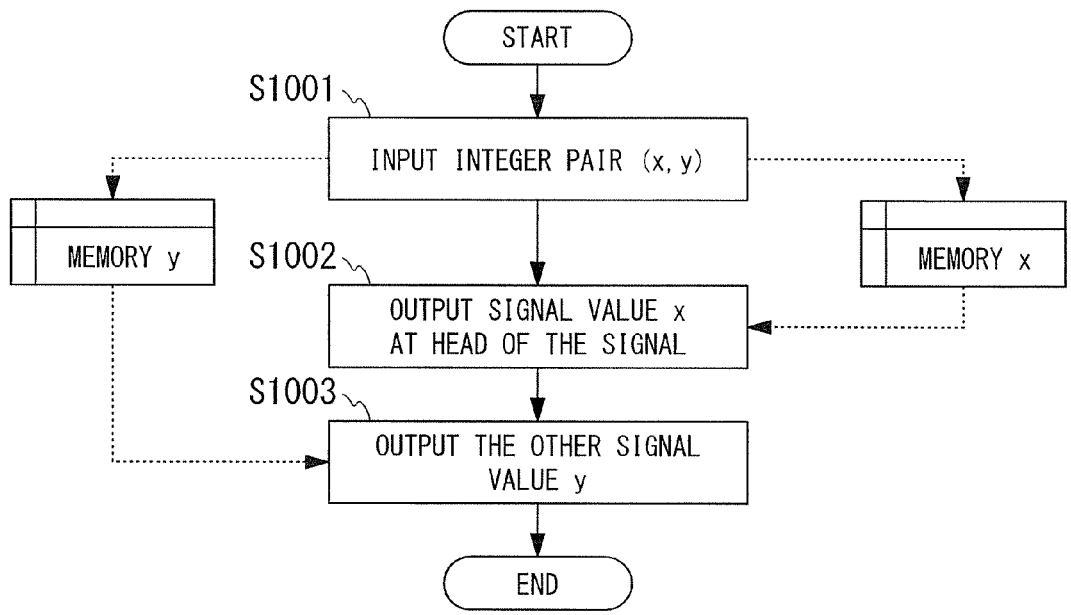
FIG. 19 also shows a detailed flowchart executed by the information source decoding apparatus of the embodiment.

FIG. 19 shows a detailed flowchart of the process executed in step S204 in the flowchart of FIG. 11.

In the relevant step S204, when receiving the integer pair (x,y) obtained by the process of step S203, in the first step S1001 of the flowchart of FIG. 19, the signal value x at the head of the received data is stored in memory x, and the other signal value y of the received data is stored in memory y.

In the next step S1002, the signal value x at the head of the data is retrieved from memory x and output, and in the next step S1003, the other signal value y is retrieved from memory y and output.

Accordingly, in step S204, by executing the flowchart of FIG. 19, the integer values x and y which form the integer pair (x,y) as the mapping result are output in the order from x to y.

INDUSTRIAL APPLICABILITY

In the present invention, a Gaussian integer signal is a target for encoding and decoding, and a structure which implements a reversible mapping for converting a Gaussian signal source into a signal source of an exponential distribution is employed. Accordingly, it is possible to easily and efficiently encode and decode a Gaussian integer signal, which has not been able to be efficiently encoded using known Golomb codes or the like although a Gaussian integer signal appears in various scenes in mathematical and engineering fields.

The invention claimed is:

1. An information source encoding method for encoding a Gaussian integer signal, the method comprising the steps of:
   inputting a signal value sequence of a Gaussian integer signal as an encoding target;
   transforming signal values included in the input signal value sequence into integer pairs, each having two integers, arranged in the input order;
   regarding each of the integer pairs as a lattice point on two-dimensional coordinates, and obtaining integer values greater than or equal to zero by performing a two-dimensional-to-one-dimensional mapping in which the shorter the distance from each lattice point to an origin of the two-dimensional coordinates, the smaller the value assigned to the lattice point by the mapping; and
   encoding the integer values using codes which are used for encoding an information source that follows an exponential distribution.

2. The information source encoding method in accordance with claim 1, wherein in the encoding step, the integer values are encoded using Golomb codes.

3. The information source encoding method in accordance with claim 2, further comprising the steps of:
   computing a dispersion of the input signal values; and
   determining a code parameter of the Golomb codes, which has a value in proportion to the computed dispersion.

4. The information source encoding method in accordance with claim 1, wherein in the step of obtaining the integer values, the integer values as the mapping result for the integer pairs are obtained by referring to a table which is prepared in advance and stores corresponding relationships between the integer pairs and the integer values.

5. The information source encoding method in accordance with claim 1, wherein in the step of obtaining the integer values, the integer values as the mapping result for the integer pairs are obtained by repeating:
   computing the minimum value of the distance from the lattice point at the origin to each lattice point which has not yet been arranged; and
   arranging the lattice points which have the minimum distance in a predetermined order and assigning an individual integer value to each arranged lattice point.

6. A non-transitory computer-readable storage medium which stores an information source encoding program by which a computer executes the steps in the information source encoding method in accordance with claim 1.

7. An information source decoding method for decoding encoded data which is generated by transforming a signal value sequence of a Gaussian integer signal as an encoding target into integer pairs, each having two integers, arranged in the input order of the signal value sequence; regarding each of the integer pairs as a lattice point on two-dimensional coordinates, and obtaining integer values greater than or equal to zero by performing a two-dimensional-to-one-dimensional mapping in which the shorter the distance from each lattice point to the origin, the smaller the value assigned to the lattice point by the mapping; and encoding the integer values using codes which are used for encoding an information source that follows an exponential distribution, the method comprising the steps of:

decoding the integer values by decoding the encoded data thereof;

restoring the integer pairs by subjecting the decoded integer values to a one-dimensional-to-two-dimensional mapping, which is an inverse mapping of the two-dimensional-to-one-dimensional mapping; and outputting integers which form each restored integer pair from a first element to a second element thereof.

8. The information source decoding method in accordance with claim 7, wherein Golomb codes are used as the codes used for encoding an information source that follows an exponential distribution.

9. The information source decoding method in accordance with claim 8, wherein:

a Golomb code parameter of the Golomb codes is used for decoding the encoded data of the integer values; and the method further comprises the step of:

inputting a Golomb code parameter set to have a value in proportion to a dispersion of signal values included in the signal value sequence.

10. The information source decoding method in accordance with claim 7, wherein in the step of restoring the integer pairs, the integer pairs as the inverse mapping result for the integer values are restored by referring to a table which is prepared in advance and stores corresponding relationships between the integer pairs and the integer values.

11. The information source decoding method in accordance with claim 7, wherein if in the two-dimensional-to-one-dimensional mapping, the integer values as the mapping result for the integer pairs are obtained by repeating:

computing the minimum value of the distance from the lattice point at the origin to each lattice point which has not yet been arranged; and arranging the lattice points which have the minimum distance in a predetermined order and assigning an individual integer value to each arranged lattice point, then in the step of restoring the integer pairs, based on the above mapping result, the integer pairs are restored as the inverse mapping result for the integer values.

12. A non-transitory computer-readable storage medium which stores an information source decoding program by which a computer executes the steps in the information source decoding method in accordance with claim 7.

13. An information source encoding apparatus for encoding a Gaussian integer signal, the apparatus comprising:

a device for inputting a signal value sequence of a Gaussian integer signal as an encoding target;

a device for transforming signal values included in the input signal value sequence into integer pairs, each having two integers, arranged in the input order;

a device for regarding each of the integer pairs as a lattice point on two-dimensional coordinates, and obtaining integer values greater than or equal to zero by performing a two-dimensional-to-one-dimensional mapping in which the shorter the distance from each lattice point to an origin of the two-dimensional coordinates, the smaller the value assigned to the lattice point by the mapping; and a device for encoding the integer values using codes which are used for encoding an information source that follows an exponential distribution.

14. The information source encoding apparatus in accordance with claim 13, wherein the encoding device encodes the integer values using Golomb codes.

15. An information source decoding apparatus for decoding encoded data which is generated by transforming a signal value sequence of a Gaussian integer signal as an encoding target into integer pairs, each having two integers, arranged in the input order of the signal value sequence; regarding each of the integer pairs as a lattice point on two-dimensional coordinates, and obtaining integer values greater than or equal to zero by performing a two-dimensional-to-one-dimensional mapping in which the shorter the distance from each lattice point to the origin, the smaller the value assigned to the lattice point by the mapping; and encoding the integer values using codes which are used for encoding an information source that follows an exponential distribution, the apparatus comprising:

a device for decoding the integer values by decoding the encoded data thereof;

a device for restoring the integer pairs by subjecting the decoded integer values to a one-dimensional-to-two-dimensional mapping, which is an inverse mapping of the two-dimensional-to-one-dimensional mapping; and a device for outputting integers which form each restored integer pair from a first element to a second element thereof.

16. The information source decoding apparatus in accordance with claim 15, wherein Golomb codes are used as the codes used for encoding an information source that follows an exponential distribution.

17. An image signal encoding method for encoding an image signal which indicates a Gaussian integer signal, the method comprising the steps of:

inputting a signal value sequence of an image signal as an encoding target;

transforming signal values included in the input signal value sequence into integer pairs, each having two integers, arranged in the input order;

regarding each of the integer pairs as a lattice point on two-dimensional coordinates, and obtaining integer values greater than or equal to zero by performing a two-dimensional-to-one-dimensional mapping in which the shorter the distance from each lattice point to an origin of the two-dimensional coordinates, the smaller the value assigned to the lattice point by the mapping; and encoding the integer values using Golomb codes.

18. An image signal decoding method for decoding encoded data which is generated by transforming a signal value sequence of an image signal, which is an encoding target and indicates a Gaussian integer signal, into integer pairs, each having two integers, arranged in the input order of the signal value sequence; regarding each of the integer pairs as a lattice point on two-dimensional coordinates, and obtaining integer values greater than or equal to zero by performing a two-dimensional-to-one-dimensional mapping in which the shorter the distance from each lattice point to the origin, the smaller the value assigned to the lattice point by the mapping; and encoding the integer values using Golomb codes, the method comprising the steps of:

decoding the integer values by subjecting the encoded data thereof to Golomb decoding;

restoring the integer pairs by subjecting the decoded integer values to a one-dimensional-to-two-dimensional mapping, which is an inverse mapping of the two-dimensional-to-one-dimensional mapping; and outputting integers which form each restored integer pair from a first element to a second element thereof.

* * * * *